United States Patent

Hosono et al.

(10) Patent No.: US 9,750,168 B2
(45) Date of Patent: Aug. 29, 2017

(54) CONVEYANCE APPARATUS FOR ELECTRONIC COMPONENTS AND APPARATUS FOR INDUSTRIAL USE EQUIPPED WITH THE CONVEYANCE APPARATUS

(71) Applicant: Murata Manufacturing Co., LTD., Kyoto-fu (JP)

(72) Inventors: Koji Hosono, Nagaokakyo (JP); Masatoshi Harada, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/244,301

(22) Filed: Aug. 23, 2016

(65) Prior Publication Data

US 2017/0064885 A1    Mar. 2, 2017

(30) Foreign Application Priority Data

Aug. 28, 2015  (JP) .................................. 2015-168959

(51) Int. Cl.
*B65G 47/82*  (2006.01)
*B65G 47/86*  (2006.01)
*H05K 13/02*  (2006.01)
*B65G 47/14*  (2006.01)

(52) U.S. Cl.
CPC ....... *H05K 13/021* (2013.01); *B65G 47/1485* (2013.01)

(58) Field of Classification Search
CPC ........ B65G 47/82; B65G 47/80; B65G 47/86; B65G 47/14; B65G 47/1485; B65G 29/00; B65B 5/10; H01L 24/95; B07C 5/344; G01R 31/00

USPC ....................  198/347.1, 471.1, 483.1, 347.2
See application file for complete search history.

(56) References Cited

U.S. PATENT DOCUMENTS

| 3,448,894 | A  | * | 6/1969  | Modrey ................. B25B 23/02 221/160 |
| 6,435,338 | B1 | * | 8/2002  | Iwamoto ............ B65G 47/1485 198/396 |
| 6,479,777 | B2 | * | 11/2002 | Yamakawa .......... H05K 13/021 198/471.1 |
| 6,540,065 | B2 | * | 4/2003  | Kurabe .............. B65G 47/1485 198/471.1 |

(Continued)

FOREIGN PATENT DOCUMENTS

| JP | H11-139553 A | 5/1999 |
| JP | 2001-026318 A | 1/2001 |
| JP | 2004-315227 A | 11/2004 |

*Primary Examiner* — James R Bidwell
(74) *Attorney, Agent, or Firm* — Studebaker & Brackett PC

(57) ABSTRACT

A depth of a cavity formed in a storing member is set to a depth which allows a portion of an electronic component to project from the cavity in a state where the electronic component is stored in the cavity. A storing member includes guide portions each of which is a space communicating with the cavity and configured to guide the electronic component into the cavity. A guide portion is formed such that a guide opening portion which is an opening portion of the guide portion is larger than an opening portion of the cavity and the opening portion of the cavity falls within a region of the guide opening portion as viewed in a depth direction of the cavity. A space formed of the cavity and the guide portion is configured to store an entire electronic component in the inside thereof.

4 Claims, 11 Drawing Sheets

(56) References Cited

U.S. PATENT DOCUMENTS

| | | | | |
|---|---|---|---|---|
| 7,390,158 B2* | 6/2008 | Takagi | ................... | H01L 24/95 |
| | | | | 198/394 |
| 8,051,975 B2* | 11/2011 | Sasaoka | ............. | G01R 31/2893 |
| | | | | 198/478.1 |
| 8,873,920 B2* | 10/2014 | Wang | ................... | G02B 6/4298 |
| | | | | 209/552 |
| 2001/0013486 A1* | 8/2001 | Yamakawa | .......... | H05K 13/021 |
| | | | | 209/574 |
| 2004/0187446 A1* | 9/2004 | Takagi | ................... | H01L 24/95 |
| | | | | 53/475 |

* cited by examiner

CONVEYANCE APPARATUS FOR ELECTRONIC COMPONENTS AND APPARATUS FOR INDUSTRIAL USE EQUIPPED WITH THE CONVEYANCE APPARATUS

CROSS REFERENCE TO RELATED APPLICATIONS

This application claims benefit of priority to Japanese Patent Application 2015-168959 filed Aug. 28, 2015, the entire content of which is incorporated herein by reference.

TECHNICAL FIELD

The present disclosure relates to a conveyance apparatus for electronic components and an apparatus for industrial use equipped with the conveyance apparatus, and more particularly to a conveyance apparatus for electronic components which is configured to convey electronic components in a state where the electronic components are stored in a plurality of cavities formed on a storing member, and an apparatus for industrial use equipped with the conveyance apparatus.

BACKGROUND

For example, in such a case where electronic components are supplied to an inspection step for inspecting properties thereof or a case where electronic components are supplied to a processing step or a mounting step, a conveyance technique has been popularly used where electronic components are stored in a plurality of holding holes formed at predetermined intervals on a holder such as a rotatable rotor, for example, and to be conveyed.

As such a conveyance apparatus, as shown in FIG. 9 and FIG. 10, JP-A-2001-26318 discloses a conveyance apparatus which includes: a movable part (conveyance rotor) 110 in which a large number of through holes (cavities) 111 are disposed along a conveyance direction of electronic components 101; and a part suction unit 120 which sucks air from a surface 110b of the movable part 110 on a side opposite to a surface on which the electronic components 101 are held (part conveyance surface 110a) thus placing the electronic components 101 on the part conveyance surface 110a by suction to be conveyed in a state where the electronic components 101 are taken into the through holes 111.

This conveyance apparatus is configured such that compressed air is supplied to spaces (131a, 131b, 131c, and 131d) for conveying the electronic components 101 which are formed by a conveyance passage cover (an intake guide for taking electronic components 101 into the through holes 111) 130, the electronic components in the spaces are agitated, and the electronic components 101 are taken into the through holes (cavities) 111 along partition walls (guides) 132 provided in a region of the conveyance passage cover 130 which opposedly face the part conveyance surface 110a of the movable part (conveyance rotor) 110 (see FIG. 10).

However, in the conveyance apparatus disclosed in JP-A-2001-26318, when the electronic component 101 is, for example, a small thin chip part, the positional relationship between the conveyance passage cover 130, to be more specific, the above-mentioned partition wall (guide) 132 and through hole (cavity) 111 becomes important.

For example, as shown in FIG. 11A, when the positional relationship between the partition wall (guide) 132 and the through hole (cavity) 111 is held at the predetermined relationship, the electronic component 101 can be taken into the through hole (cavity) 111 with high accuracy.

On the other hand, as shown in FIG. 11B, when displacement occurs in the positional relationship, it becomes difficult to take the electronic component 101 into the through hole (cavity) 111 with high accuracy.

Further, when the movable part (conveyance rotor) 110 is rotated in a state where the electronic component 101 is not completely stored in the through hole (cavity) 111 of the movable part (conveyance rotor) 110, (that is, in a state where a portion of the electronic component 101 projects from the through hole (cavity) 111), rubbing occurs between the electronic component 101 and other members such as the conveyance passage cover 130 which is fixed and is not rotatable thus giving rise to a drawback that the electronic component 101 is damaged.

The above-mentioned change in positional relationship occurs due to the positional displacement of the conveyance passage cover 130, a change in size of the movable part (conveyance rotor) 110 due to a change in temperature, absorption or discharge of moisture (moisture) or the like. Accordingly, under the current situation, it is difficult to completely prevent a change in the positional relationship.

SUMMARY

The present disclosure has been made to overcome the above-mentioned drawbacks, and it is an object of the present disclosure to provide a conveyance apparatus for electronic components where, even when a position of the electronic components to be supplied is changed, electronic components can be stored with certainty in cavities formed on the holder such as a rotor for conveyance, and the electronic components can be smoothly conveyed without being damaged in the course of the conveyance, and an apparatus for industrial use equipped with the conveyance apparatus.

To overcome the above-mentioned drawbacks, according to one aspect of the present disclosure, there is provided a conveyance apparatus for electronic components including:

a storing member having a plurality of cavities in which an electronic component is stored respectively, an electronic component supply mechanism configured to supply a plurality of electronic components to be stored in the cavities to the storing member; and a moving unit configured to move the storing member in a predetermined direction in a relative relationship with the electronic component supply mechanism, the electronic components being sequentially stored in the plurality of cavities by moving the storing member and the electronic component supply mechanism relative to each other such that the plurality of respective cavities opposedly face the electronic components sequentially supplied from the electronic component supply mechanism, wherein a depth of the cavity is set to a depth which allows a portion of the electronic component to project from the cavity in a state where the electronic component is stored in the cavity in a predetermined posture, the storing member includes guide portions each of which is a space communicating with the cavity and configured to guide the electronic component into the cavity, the guide portion is formed such that a guide opening portion which is an opening portion of the guide portion is larger than an opening portion of the cavity and the opening portion of the cavity falls within a region of the guide opening portion as viewed in a depth direction of the cavity, and a storing space formed of the cavity and the guide portion is configured to store an entire electronic component in the inside thereof.

In the present disclosure, "a moving unit configured to move the storing member in a predetermined direction in a relative relationship with the electronic component supply mechanism" means that the moving unit is used in any one of a mode where the moving unit moves the storing member, a mode where the moving unit moves an electronic component supply mechanism, and a mode where the moving unit moves both the storing member and the electronic component supply mechanism.

In the conveyance apparatus for electronic components of the present disclosure, it is preferable that the guide portion have a size which prevents another electronic component which entered the guide portion from projecting from the guide portion, even when another electronic component enters the guide portion in a state where the electronic component is stored in the cavity.

With such a configuration, even when another electronic component enters the guide portion in a state where the electronic component is stored in the cavity, in sequentially moving the storing member and the electronic component supply mechanism relative to each other, there is no possibility that the electronic component is brought into contact with other members such as the electronic component supply mechanism so that the electronic component does not receive damage such as rubbing or breakage of a surface. Accordingly, it is possible to provide a highly reliable conveyance apparatus for electronic components.

It is preferable that, among the plurality of cavities which the storing member has, the guide portions which correspond to at least a pair of cavities adjacent to each other in a direction of relative movement between the electronic component supply mechanism and the storing member be formed integrally so as to communicate with each other.

With such a configuration, an electronic component which enters the guide portion but is not stored in the cavity is guided into and stored in the next cavity and hence, probability that the electronic component is stored in the cavity can be enhanced.

According to another aspect of the present disclosure, there is provided an apparatus for industrial use including:

the above-mentioned conveyance apparatus for electronic components according to the present disclosure; and an action portion which acts on the electronic components stored in the plurality of cavities, wherein the storing member and the action portion are configured to be sequentially moved relative to each other such that the plurality of cavities in which the electronic components are stored opposedly face the action portion sequentially, and the action portion is configured to act on the electronic component in a state where at least a portion of the action portion is inserted into the guide portion.

As described above, in the conveyance apparatus for electronic components of the present disclosure, a depth of the cavity is set to a depth which allows a portion of the electronic component to project from the cavity in a state where the electronic component is stored in the cavity in a predetermined posture, and the storing member includes guide portions each of which is a space communicating with the cavity and configured to guide the electronic component into the cavity. The guide portion is formed such that a guide opening portion which is an opening portion of the guide portion is larger than an opening portion of the cavity and the opening portion of the cavity falls within a region of the guide opening portion as viewed in a depth direction of the cavity, and a storing space formed of the cavity and the guide portion is configured to store an entire electronic component in the inside thereof.

As a result, even when some irregularities occur with respect to the position where the electronic components are supplied, the guide portion having the opening portion larger than the opening portion of the cavity can allow such irregularities and hence, the electronic components can be stored in the cavities with certainty. That is, even when the position where the electronic components are supplied is displaced to some extent, the guide portion having the opening portion larger than the opening portion of the cavity can catch the electronic component with certainty and hence, probability that the electronic components are stored in the cavities can be enhanced.

Since the electronic component can be stored in the storing space formed of the cavity and the guide portion with certainty, even when the storing member is moved in the predetermined direction in the relative relationship with the electronic component supply mechanism, it is possible to suppress or prevent the electronic component stored in the cavity from being brought into contact with other members such as the electronic component supply mechanism, thus preventing the electronic component from being damaged.

The apparatus for industrial use of the present disclosure includes: the above-mentioned conveyance apparatus for electronic components of the present disclosure; and an action portion which acts on the electronic components stored in the cavities, the storing member and the action portion are configured to be sequentially moved relative to each other such that the plurality of cavities in which the electronic components are stored opposedly face the action portion sequentially, and the action portion is configured to act on the electronic component in a state where at least a portion of the action portion is inserted into the guide portion. Accordingly, positioning of the action portion is performed by the guide portion and hence, it is possible to allow the action portion to act on the electronic component in a state where the relative positional accuracy between the electronic component and the action portion is held at a high level. Therefore, it is possible to provide a highly reliable apparatus for industrial use.

When the guide portion is independently provided for each cavity, an insertion depth of the action portion can be controlled by each guide portion which corresponds to the cavity and hence, it is possible to suppress or prevent the action portion from impinging on a corner portion or the like of the electronic component, and the electronic component from being damaged.

When the guide portion is continuously formed extending over the plurality of cavities, the action portion can be continuously guided along the guide portion and hence, the positions of the cavities and the position of the action portion can be controlled whereby positioning of the cavities and the action portion can be performed stably with high accuracy at the time of sequentially making the action portion opposedly face the plurality of electronic components.

In the apparatus for industrial use according to the present disclosure, as the action portion, for example, a measurement terminal for measuring an electrical property, a tool or a laser generating unit for processing an electronic component, an imaging unit such as a camera, a light source for emitting an infrared ray or the like, a dispenser for applying a paste such as a conductive paste or an insulating paste are exemplified. However, the action portion is not limited to these elements, and other elements may be also used as the action portion.

For example, the apparatus for industrial use according to the present disclosure becomes a property inspection apparatus when the apparatus includes the measurement terminal as described above as the action portion, and becomes a processing apparatus when the apparatus includes a tool or a laser generating unit for processing as the action portion. Further, the apparatus for industrial use according to the present disclosure may become an external appearance inspection apparatus when the apparatus includes an imaging unit as the action portion. The apparatus for industrial use according to the present disclosure may become a paste applying apparatus when the apparatus includes a dispenser for applying a paste as the action portion.

BRIEF DESCRIPTION OF THE DRAWINGS

FIG. 2A and FIG. 2B are views schematically showing the configuration of a main part of the conveyance apparatus for electronic components according to the embodiment 1 of the present disclosure, wherein FIG. 2A is a view showing the configuration of a cavity and a guide portion in a state where an electronic component is not stored in the cavity, and FIG. 2B is a view showing the configuration of the cavity and the guide portion in a state where the electronic component is stored in the cavity.

FIG. 5A and FIG. 5B are views showing a modification of a guide portion of the conveyance apparatus for electronic components according to the embodiment 1 of the present disclosure, wherein FIG. 5A is a view showing a state where an electronic component is in the course of being stored in a cavity, and FIG. 5B is a view showing a state where the electronic component is stored in the cavity.

FIG. 6A and FIG. 6B are views schematically showing the configuration of a main part of a conveyance apparatus for electronic components according to another embodiment (embodiment 2) of the present disclosure, wherein FIG. 6A is a view showing the configuration of a cavity and a guide portion in a state where an electronic component is not stored in the cavity, and FIG. 6B is a view showing the configuration of the cavity and the guide portion in a state where the electronic component is stored in the cavity.

FIG. 7A and FIG. 7B are views schematically showing the configuration of a main part of a conveyance apparatus for electronic components according to still another embodiment (embodiment 3) of the present disclosure, wherein FIG. 7A is a view showing the configuration of a cavity and a guide portion in a state where an electronic component is not stored in the cavity, and FIG. 7B is a view showing the configuration of the cavity and the guide portion in a state where the electronic component is stored in the cavity.

FIG. 8A and FIG. 8B are views schematically showing the configuration of a main part of an apparatus for industrial use according to still another embodiment (embodiment 4) of the present disclosure, wherein FIG. 8A is a view showing a state before an action portion is brought into contact with an electronic component in a cavity, and FIG. 8B is a view showing a state where the action portion is brought into contact with the electronic component in the cavity.

FIG. 11A and FIG. 11B are schematic views for describing a problem of the conventional conveyance apparatus for electronic components, wherein FIG. 11A is a view showing a stored state of an electronic component when the positional relationship between a partition wall (guide) and a through hole (cavity) is held at the predetermined relationship, and FIG. 11B is a view showing a stored state of the electronic component when displacement occurs in the positional relationship between the partition wall and the through hole.

DETAILED DESCRIPTION

Hereinafter, the technical features of the present disclosure are described in further detail in accordance with embodiments of the present disclosure.
Embodiment 1

Figure 1:
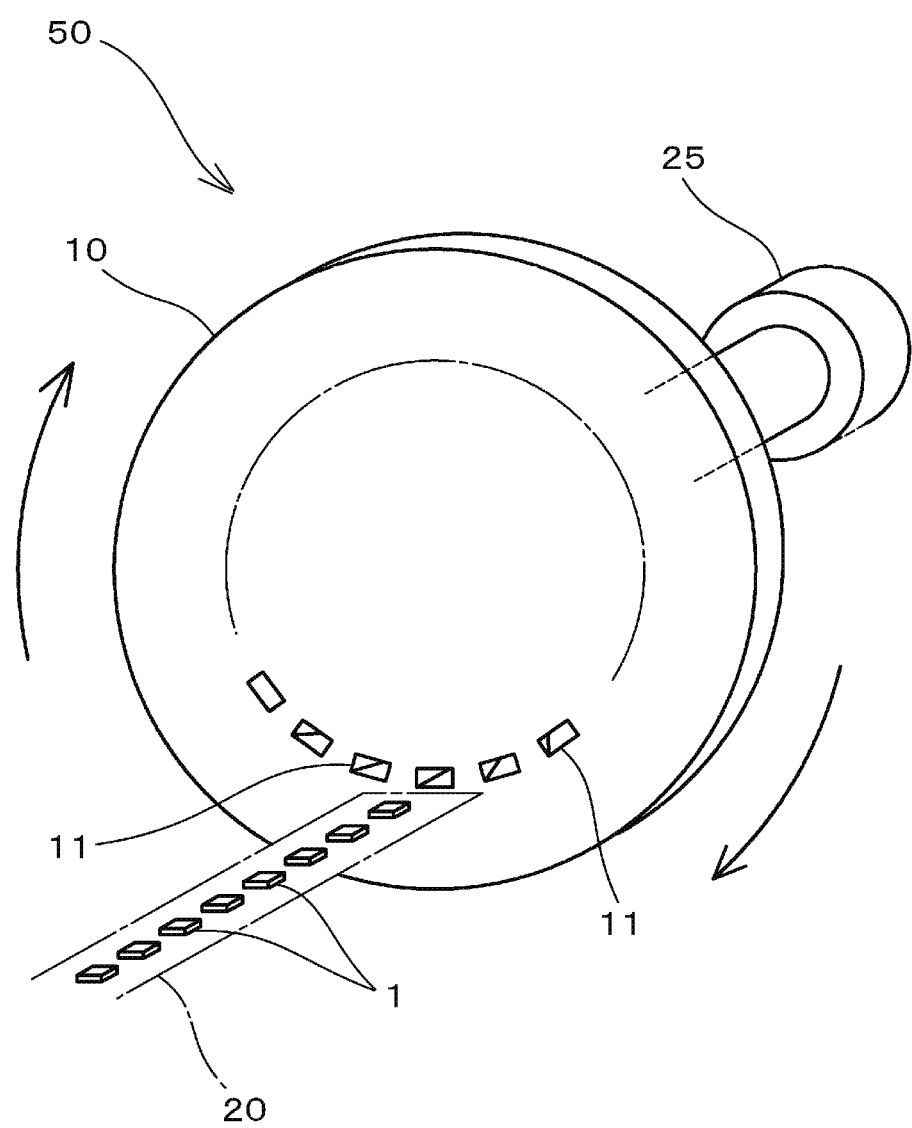
FIG. 1 is a view schematically showing the configuration of a conveyance apparatus for electronic components according to one embodiment (embodiment 1) of the present disclosure.
Figure 2A:
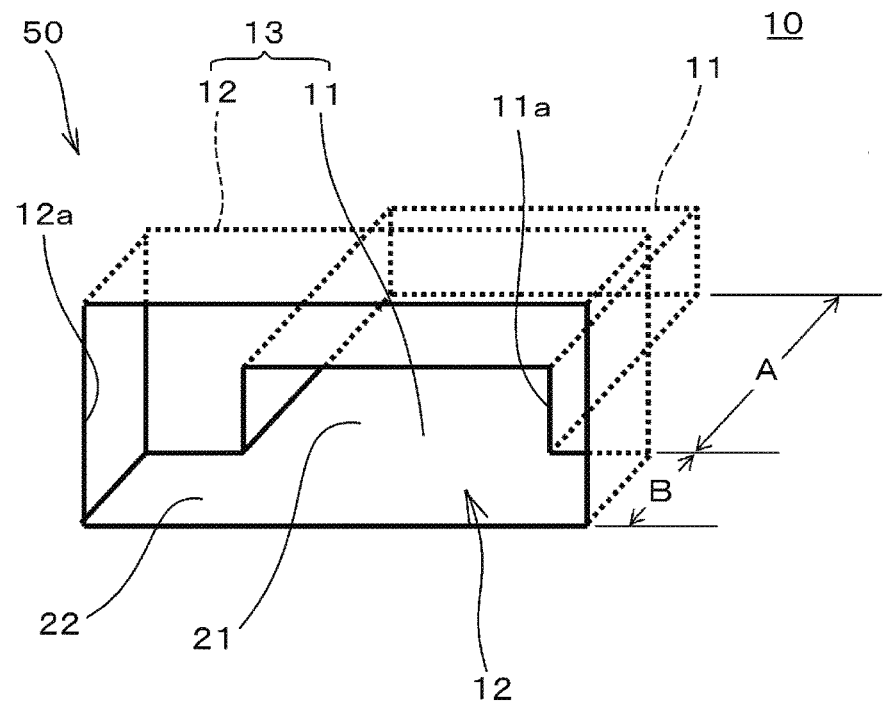
Figure 2B:
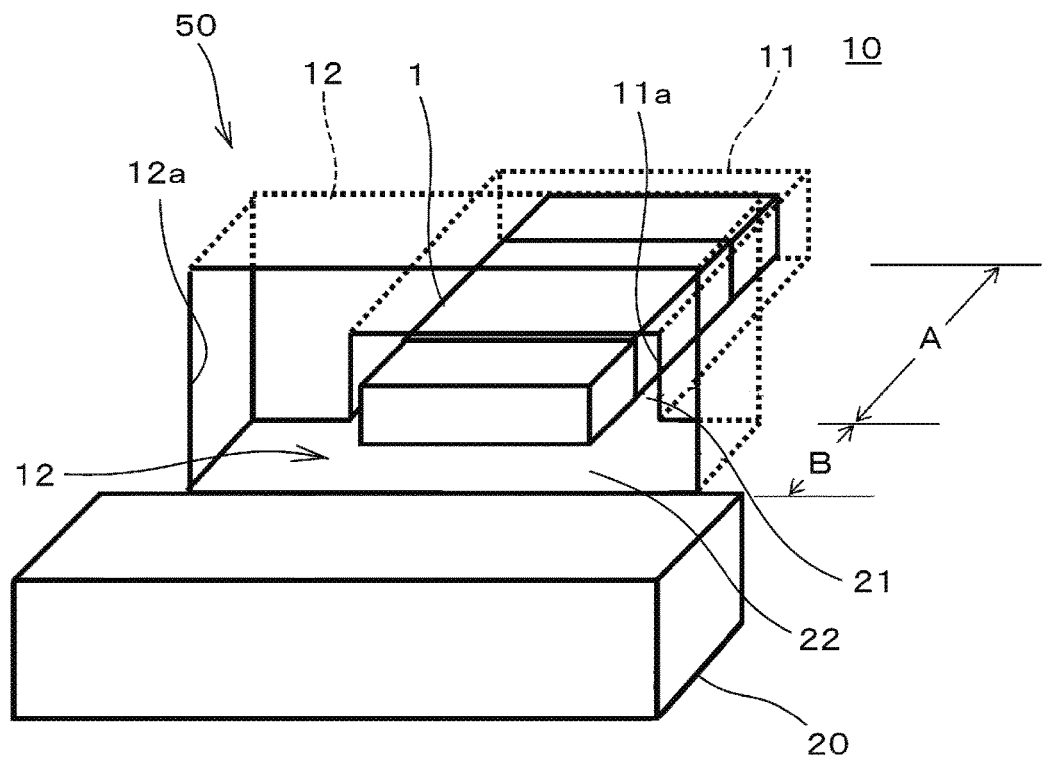

FIG. 1 is a perspective view schematically showing the configuration of a conveyance apparatus for electronic components according to one embodiment (embodiment 1) of the present disclosure, and FIG. 2A and FIG. 2B are views showing a main part in an enlarged manner.

Figure 3:
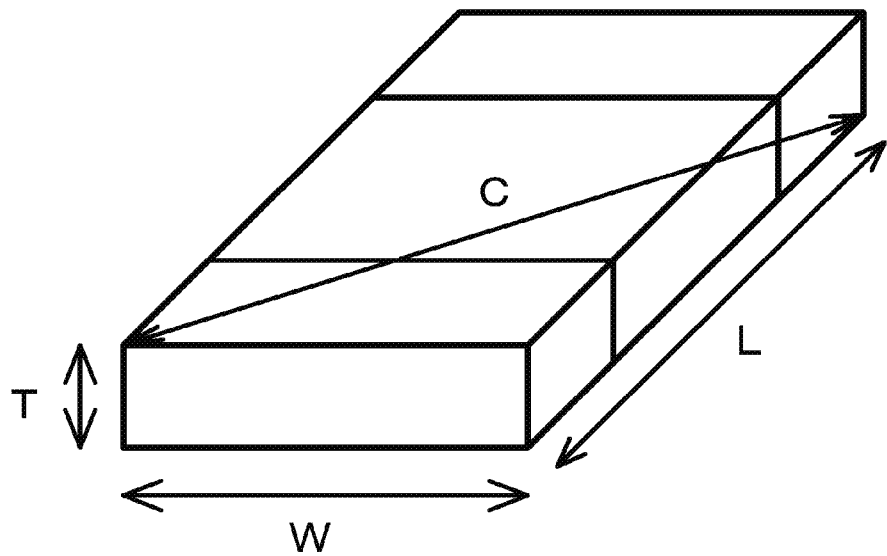
FIG. 3 is a view showing an electronic component which is an object to be stored and conveyed by the conveyance apparatus for electronic components according to the embodiment 1 of the present disclosure.

FIG. 3 is a perspective view showing the configuration of an electronic component which is an object to be conveyed by the conveyance apparatus for electronic components of the present disclosure.

As shown in FIG. 1 and FIG. 2, the conveyance apparatus for electronic components of the embodiment 1 includes: a disc-like storing member (rotor) 10 on which a plurality of cavities 11 which store an electronic component 1 therein respectively are formed at predetermined intervals in the circumferential direction; an electronic component supply mechanism 20 which supplies a plurality of electronic components 1 to the storing member 10; and a moving unit 25 which moves the storing member 10 in a predetermined direction in a relative relationship with the electronic component supply mechanism 20.

In the embodiment 1, the storing member 10 is made of a resin for insulating an electrical connection between the storing member 10 and the electronic component 1.

In the embodiment 1, for example, a rotary drive unit such as an electric motor which rotates the storing member (rotor) 10 is used as the moving unit 25.

The electronic components 1 are sequentially stored in the plurality of cavities 11 by moving the storing member 10 and the electronic component supply mechanism 20 relative to each other (in the embodiment 1, as described above, the cavities 11 are sequentially moved by rotating the storing member 10) such that the plurality of respective cavities 11 opposedly face the electronic components 1 sequentially supplied from the electronic component supply mechanism 20.

Further, in the conveyance apparatus 50 for electronic components of the embodiment 1, a depth A of the cavity 11

(a size from an opening portion 11a side to an inner wall surface on a depth side of the cavity 11) is set to a depth which allows a portion of the electronic component 1 to project from the cavity 11 in a state where the electronic component 1 is stored in the cavity 11 in a predetermined posture, that is, in a posture where the direction of a length L in the electronic component 1 (see FIG. 3) agrees with the depth direction of the cavity.

The storing member 10 includes guide portions 12 each of which is a space communicating with the cavity 11 and guiding the electronic component 1 into the cavity 11.

The guide portion 12 is formed such that a guide opening portion 12a which is an opening portion of the guide portion 12 is larger than an opening portion 11a of the cavity 11, and the opening portion 11a of the cavity 11 falls within a region of the guide opening portion 12a as viewed in the depth direction of the cavity 11.

In the conveyance apparatus 50 for electronic components of the embodiment 1, a space (a storing space for storing the electronic component therein) 13 formed of the cavity 11 and the guide portion 12 stores an entire electronic component in the inside thereof so that any portion of the electronic component 1 does not project from the guide opening portion 12a.

In the conveyance apparatus 50 for electronic components of the embodiment 1, as shown in FIG. 2, the cavity 11 has a rectangular parallelepiped shape, and the opening portion 11a of the cavity 11 has a laterally elongated rectangular shape.

As shown in FIG. 2, the guide portion 12 which is a space communicating with the cavity 11 and guiding the electronic component 1 into the cavity 11 also has a rectangular parallelepiped shape, and the guide opening portion 12a has a rectangular shape.

In the conveyance apparatus 50 for electronic components of the embodiment 1, to smoothly store the electronic component 1 in the cavity 11 through the guide portion 12, a bottom surface (guide surface) 22 of the guide portion 12 is formed coplanar with a bottom surface 21 of the cavity 11.

Next, the configuration of the conveyance apparatus 50 for electronic components of the embodiment 1 having the above-mentioned configuration is described in further detail.

The conveyance apparatus 50 for electronic components according to the embodiment 1 of the present disclosure having the above-mentioned configuration is used as an apparatus for sorting electronic components based on property, an apparatus for sorting electronic components based on external appearance, an apparatus for processing parts including the formation of external electrodes or leads, an apparatus for packing including taping, a feeder for electronic components, and an apparatus for conveyance used by being connected to the above-mentioned apparatuses, for example.

It is preferable that, as shown in FIG. 3, an electronic component which is an object to be conveyed by the apparatus of the present disclosure satisfy the condition that $L>W$, $L>T$ and $W \geq T$ assuming a length of the electronic component as L, a width of the electronic component as W, and a height of the electronic component as T.

It is particularly desirable that the electronic component satisfy the following condition.

$5 > L > 0.1$ $4 > W > 0.05$ $4 > T > 0.01$

As the electronic component which is an object to be conveyed by the conveyance apparatus 50 for electronic components of the present disclosure, a chip-type electronic component such as a laminated ceramic capacitor, a thermistor or a coil can be named, for example, but is not limited to those.

In the embodiment 1, a disc-like rotor which has the cavities 11 and can move the cavities 11 in the circumferential direction is used as the storing member 10. However, the storing member 10 is not limited to the rotor. The storing member 10 may be a belt-like storing member which can convey electronic components in the predetermined direction. The storing member 10 may also be a flat-plate-like member which can move the cavities in the direction parallel to a main surface of the member (linearly). The storing member 10 may also be a roll having a cylindrical shape where a plurality of cavities in each of which an electronic component is stored are formed on an outer peripheral surface of the roll, and the roll is rotatable about the axis direction thereof.

As a material for forming the storing member, various kinds of materials including glass, ceramics such as zirconia, a resin, metal and the like can be used. In the embodiment 1, the resin storing member 10 is used.

In the conveyance apparatus 50 for electronic components of the present disclosure, the electronic component may be conveyed (the storing member may be driven) continuously or intermittently.

The electronic component supply mechanism 20 for supplying the plurality of electronic components 1 to the storing member 10 is disposed to opposedly face the storing member 10 and supplies the electronic components 1 to the storing member 10. A vibrating feeder, a load track or the like is used as the electronic component supply mechanism 20, for example.

In the conveyance apparatus 50 for electronic components of the present disclosure, the mode of arrangement of the cavities 11 formed on the storing member is not particularly limited. In the above-mentioned embodiment 1, the description has been made by taking the case where the plurality of cavities 11 are arranged in one row in the circumferential direction as an example. However, a plurality of cavities 11 may be arranged in parallel in plural rows.

When members to be conveyed are flat-plate-like members or cylindrical (roll-like) members, cavities may be arranged in a matrix array.

The cavities may have various kinds of shapes such as a square shape, a rectangular shape, a circular shape or an oval shape as viewed in the depth direction of the cavity.

An opening portion of the cavity may be tapered.

It is desirable that the depth A of the cavity 11 (FIG. 2) is set larger than ½ of the length L of the electronic component 1 and smaller than the length L of the electronic component 1 (that is, the condition of $(L/2)<A<L$ be satisfied) in a state where the electronic component 1 is stored in the cavity with a posture that the length L direction of the electronic component 1 agrees with the depth direction of the cavity.

It is also desirable that the guide portion 12 have an opening portion (guide opening portion 12a) larger than the opening portion 11a of the cavity, and the opening portion 11a of the cavity 11 falls within a region of the guide opening portion 12a as viewed in the depth direction of the cavity 11.

The guide opening portion 12a may have various kinds of shapes such as a square shape, a rectangular shape, a circular shape or an oval shape.

It is desirable that, assuming the depth of the cavity as "A" and the length of the electronic component as "L", a depth B of the guide portion 12 satisfy the relationship of A+B>L and the relationship of B>W/2.

It is further desirable that A+B be larger than a length C of a three-dimensional diagonal line of the electronic component (see FIG. 3) (A+B>C).

With the use of the conveyance apparatus 50 for electronic components having the above-mentioned configuration, the electronic components 1 can be efficiently stored in the cavities 11 with certainty.

Figure 4A:
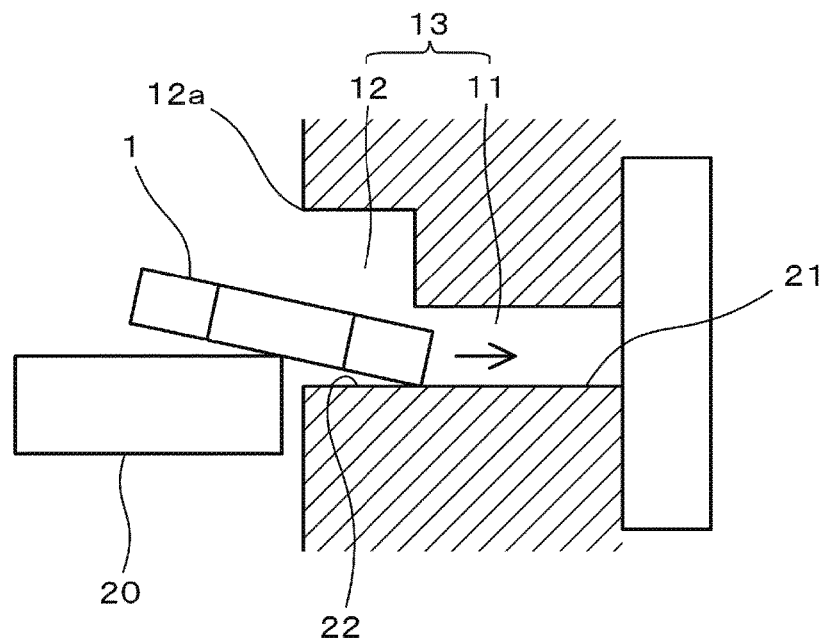
FIG. 4A is a view showing a state where an electronic component is in the course of being stored in a cavity of the conveyance apparatus for electronic components according to the embodiment 1 of the present disclosure.
Figure 4B:
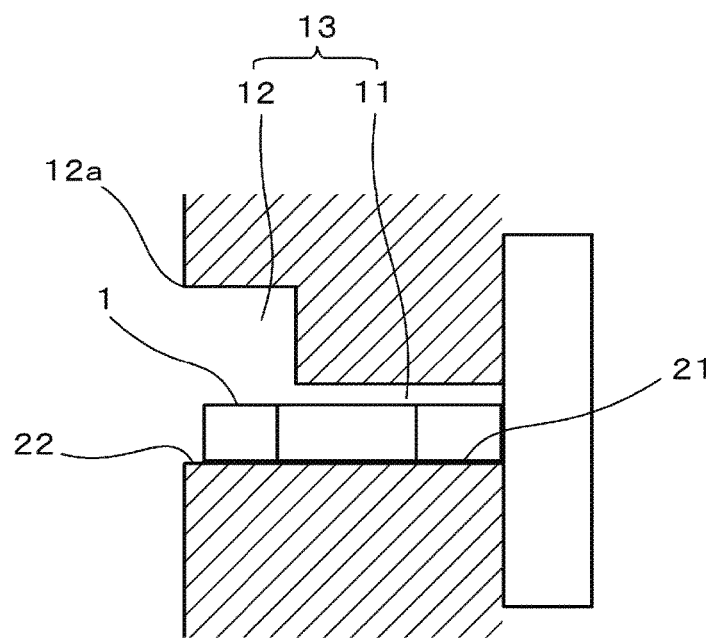
FIG. 4B is a view showing a state where the electronic component is stored in the cavity.
Figure 11A:
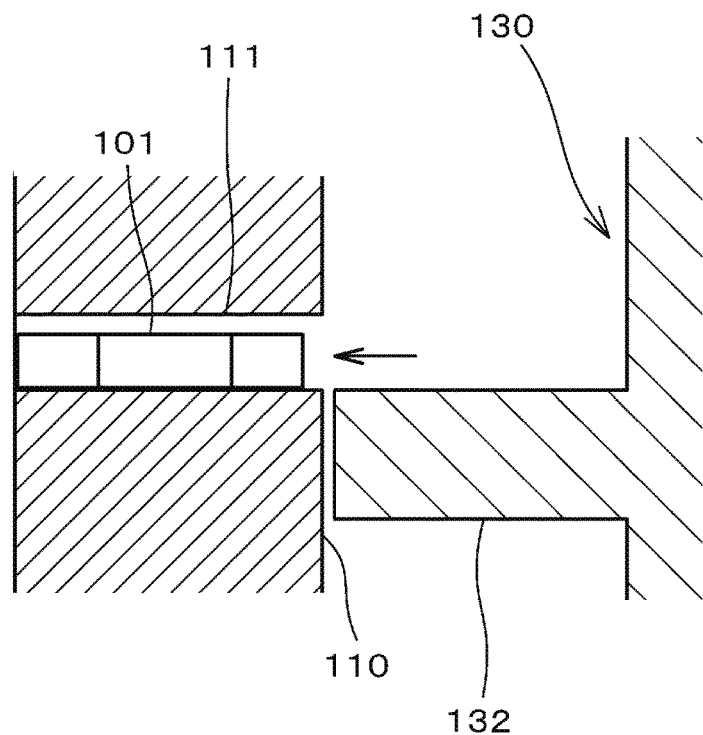
Figure 11B:
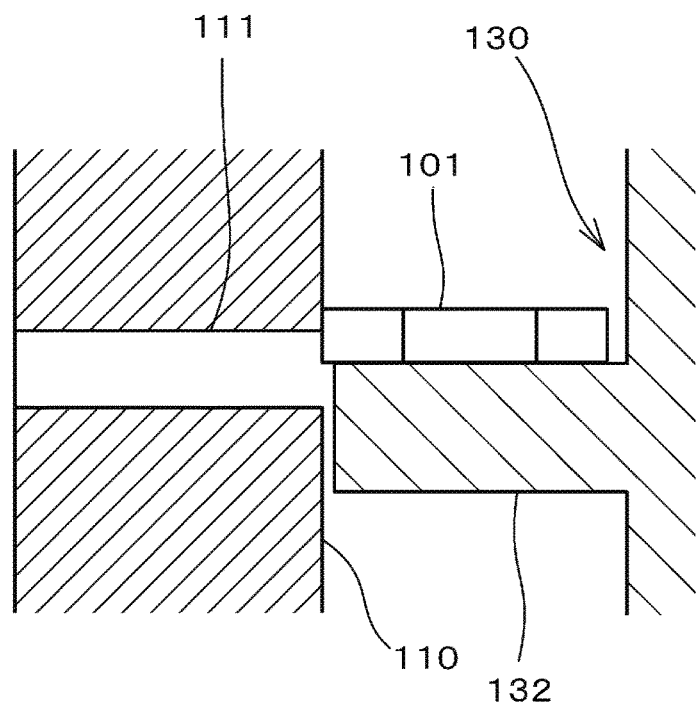

In the prior art described previously, partition walls (intake guide) which are separate bodies from the conveyance rotor which forms the storing member play a role of guiding an electronic component into the cavities. Accordingly, for example, when the conveyance rotor is expanded or contracted due to absorption or discharge of moisture, displacement occurs in the positional relationship between the conveyance rotor and the partition wall (intake guide) so that it becomes difficult to store the electronic component in the cavity (see FIG. 11B). On the other hand, in the conveyance apparatus 50 for electronic components of the present disclosure, the guide portions 12 which are formed on the storing member (rotor) 10 play a role of guiding the electronic components 1 into the cavities 11. Accordingly, even when the storing member 10 is expanded or contracted due to absorption or discharge of moisture, the irregularities in size of the storing member 10 can be allowed by the guide portions 12 each having the guide opening portion 12a larger than the opening portion 11a of the cavity 11 in size and hence, the electronic components 1 can be stably stored in the cavities 11 and are conveyed (see FIG. 4A, FIG. 4B).

In the case of the conveyance apparatus 50 for electronic components of the present disclosure, at the time of exchanging the storing member 10 or at the time of exchanging a type of the electronic components 1 which are objects to be conveyed, the delicate positional adjustment of the storing member 10 and the electronic component supply mechanism 20 can be simplified or becomes unnecessary and hence, productivity can be enhanced.

The electronic component 1 stored in the cavity 11 is rotatably moved integrally with the cavity 11 and the guide portion 12 in a state of being stored in the storing space 13 formed of the cavity 11 and the guide portion 12. Accordingly, there is no possibility that the electronic component 1 is damaged including a case where the electronic component 1 is brought into contact with other members such as the electronic component supply mechanism 20 and a case where the electronic component 1 is rubbed by other members and hence, a yield rate can be enhanced.

Figure 5A:
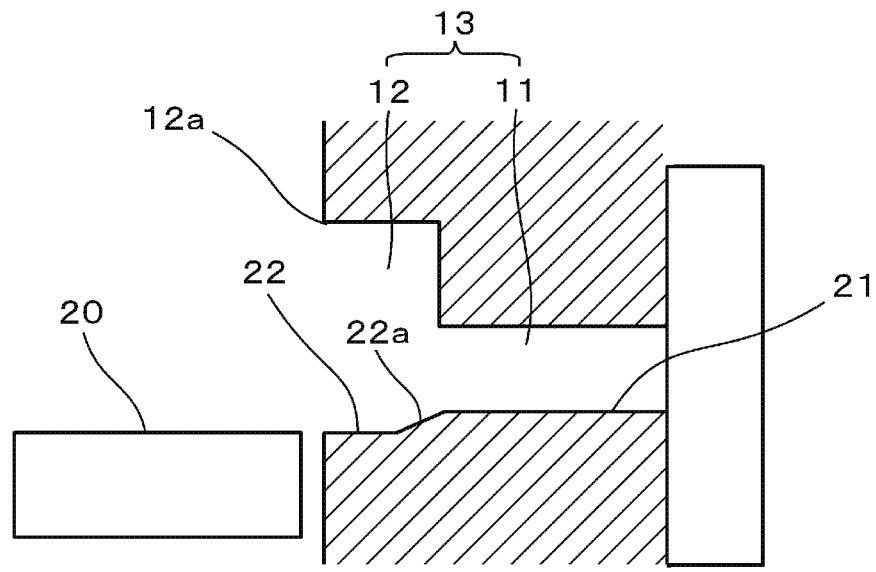
Figure 5B:
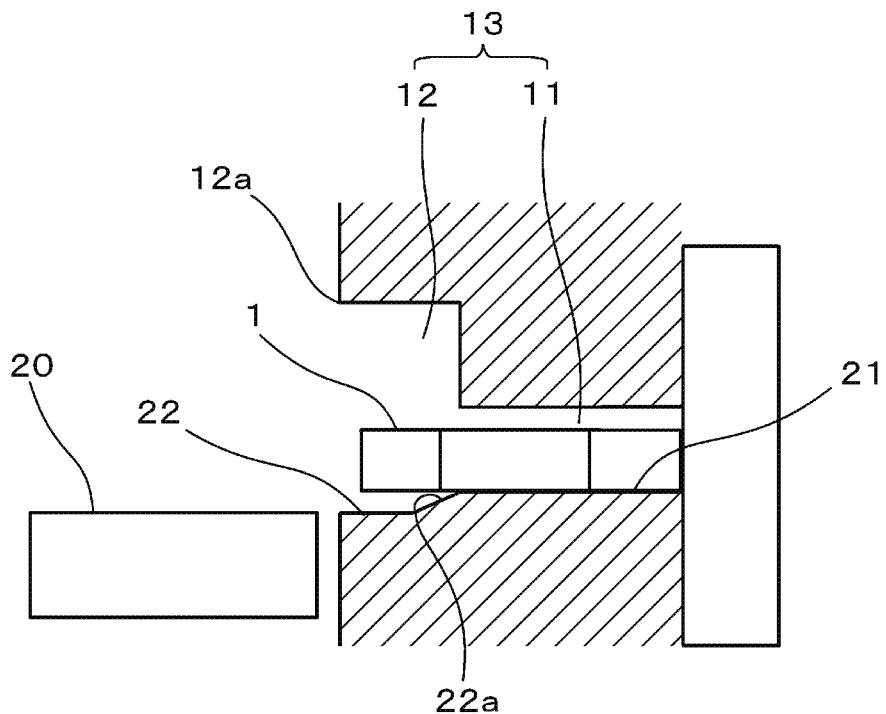

In the embodiment 1, the description has been made by taking the case where the bottom surface (guide surface) 22 of the guide portion 12 and the bottom surface 21 of the cavity 11 are formed coplanar with each other as an example. However, a stepped portion having a thickness substantially equal to a thickness T of the electronic component 1 may be formed between the bottom surface (guide surface) 22 of the guide portion 12 and the bottom surface 21 of the cavity 11, for example. In the case of forming the stepped portion between the bottom surface 22 and the bottom surface 21, as shown in FIG. 5A and FIG. 5B, it is desirable that an inclination 22a be made toward the opening portion 11a of the cavity 11 from the midst of the bottom surface 22 of the guide portion 12 (or from the opening portion 12a of the guide portion 12). By making the inclination 22a, the electronic component 1 can easily enter the cavity 11 (FIG. 5B). It is desirable that an angle θ of the inclination 22a be usually set to 45 degrees or less with respect to the bottom surface 21 of the cavity 11.

Embodiment 2

Figure 6A:
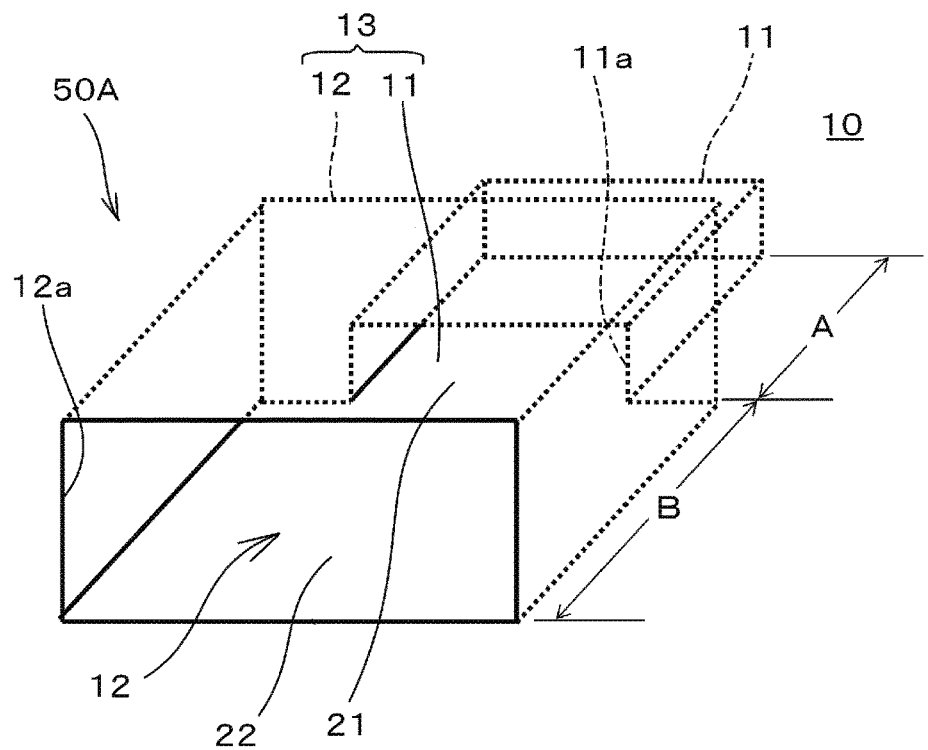
Figure 6B:
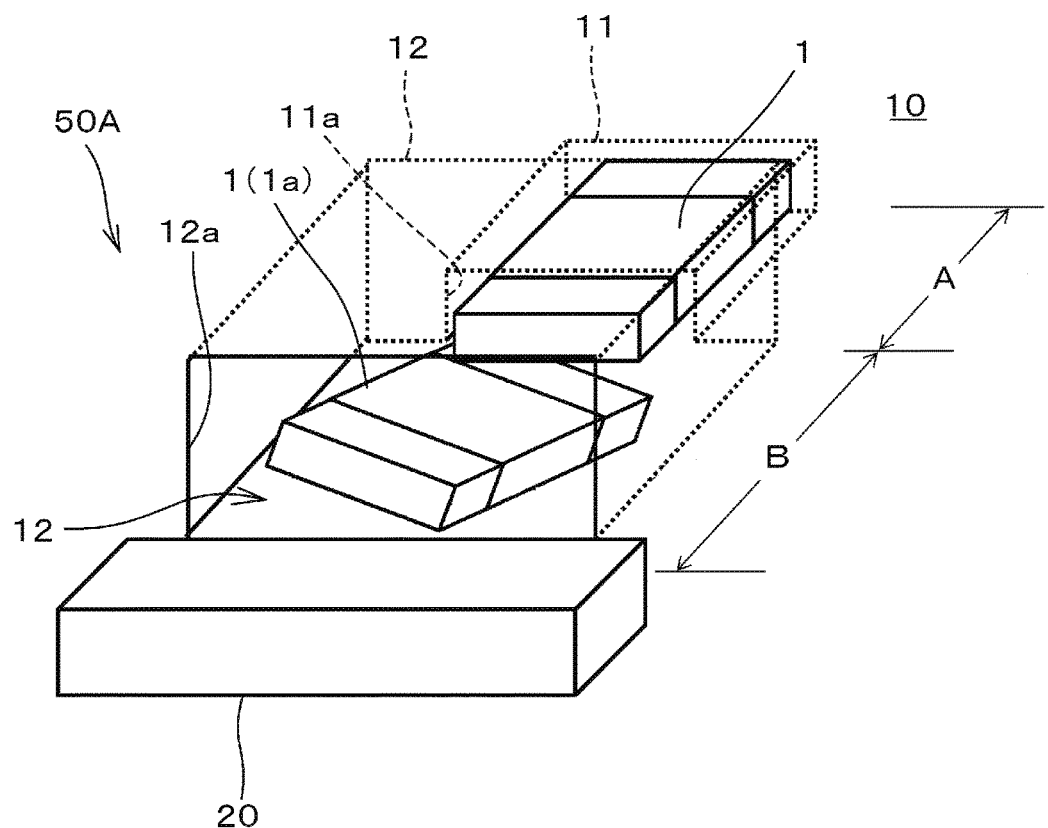

FIG. 6A and FIG. 6B are views showing the configuration of a main part of a conveyance apparatus 50A for electronic components according to another embodiment (embodiment 2) of the present disclosure.

The conveyance apparatus 50A for electronic components of the embodiment 2 has substantially the same configuration as the above-mentioned conveyance apparatus 50 for electronic components of the embodiment 1. However, as shown in FIG. 6A and FIG. 6B, the configuration of the conveyance apparatus 50A for electronic components of the embodiment 2 differs from the configuration of the conveyance apparatus 50 for electronic components of the embodiment 1 with respect to points that a depth B of a guide portion 12 which is a space communicating with a cavity 11 and guiding an electronic component 1 to the cavity is set equal to or larger than a length C of a three-dimensional diagonal line of the electronic component 1 (see FIG. 3 and FIG. 6B) (that is, the relationship of B≥C is satisfied). Other configurations of the conveyance apparatus 50A for electronic components of the embodiment 2 are substantially equal to the corresponding configurations of the conveyance apparatus 50 for electronic components of the embodiment 1.

In the embodiment 2, a height of the guide portion 12 is set more than twice as large as a thickness of the electronic component 1 and hence, even when the electronic component 1 stored in the cavity 11 and another electronic component 1 (1a) which enters the guide portion 12 overlap with each other in the thickness direction, the electronic component 1 (1a) can be stored in the guide portion 12.

In the conveyance apparatus 50A for electronic components of the embodiment 2, the depth B of the guide portion is set equal to or larger than the length C of the three-dimensional diagonal line of the electronic component 1 and hence, as shown in FIG. 6B, even when another electronic component 1 (1a) enters the guide portion 12 besides the electronic component stored in the cavity 11, the guide portion 12 is rotatably moved integrally with the cavity 10 in a state where the electronic component 1 (1a) is stored in the guide portion 12. Accordingly, this can prevent the electronic component 1 (1a) from being brought into contact with other members such as the electronic component supply mechanism 20, and prevent the electronic component 1 (1a) from being damaged such as by rubbing or breakage of a surface. As a result, reliability of the conveyance apparatus 50A for electronic components of the embodiment 2 can be enhanced.

Modifications and variations substantially equal to the modifications and variations of the above-mentioned conveyance apparatus 50 for electronic components of the embodiment 1 are conceivable also with respect to the conveyance apparatus 50A for electronic components of the embodiment 2.

Embodiment 3

Figure 7A:
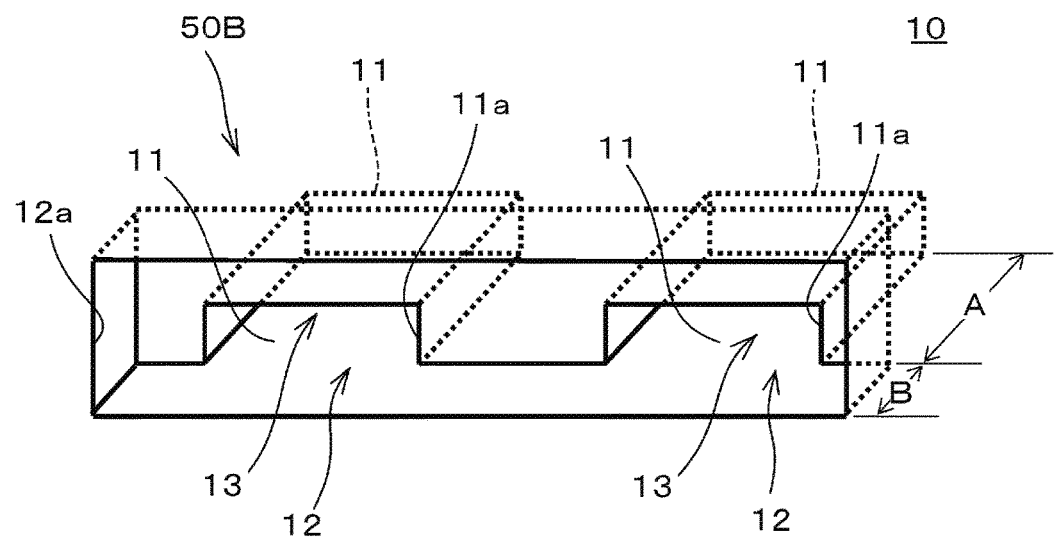
Figure 7B:
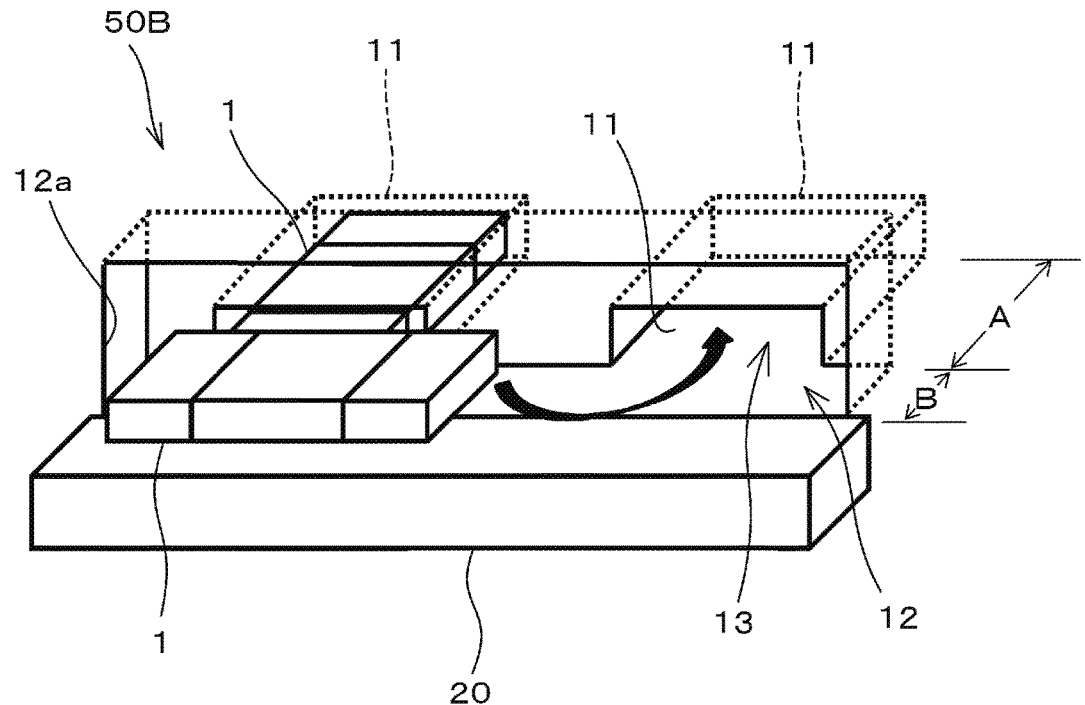

FIG. 7A and FIG. 7B are views showing the configuration of a main part of a conveyance apparatus 50B for electronic components according to another embodiment (embodiment 3) of the present disclosure.

The conveyance apparatus 50B for electronic components of the embodiment 3 has substantially the same configuration as the configuration of the above-mentioned conveyance apparatus 50 of the embodiment 1. However, as shown in FIG. 7A and FIG. 7B, the conveyance apparatus 50B for electronic components of the embodiment 3 differs from the conveyance apparatus 50 for electronic components of the embodiment 1 with respect to points where, among a plurality of cavities 11 which are formed on a storing member 10, guide portions 12 which correspond to at least a pair of cavities 11, 11 adjacent to each other in a direction of relative movement between the electronic component supply mechanism 20 and the storing member 10 are formed integrally so as to communicate with each other (that is, one guide portion 12 is disposed so as to extend between and over the pair of cavities 11, 11 adjacent to each other). Other configurations of the conveyance apparatus 50B for electronic components of the embodiment 3 are substantially equal to the corresponding configurations of the conveyance apparatus 50 for electronic components of the embodiment 1.

In the case of the conveyance apparatus 50B for electronic components of the embodiment 3, as shown in FIG. 7B, the electronic component 1 which is not yet stored in the cavity 11 is guided to the next cavity 11 through the guide portion 12 formed so that electronic component 1 can reach a region which corresponds to the next cavity 11 and hence, probability that the electronic component 1 is stored in the cavity 11 is increased.

Modifications and variations substantially equal to the modifications and variations of the above-mentioned conveyance apparatus 50 for electronic components of the embodiment 1 are also conceivable with respect to the conveyance apparatus 50B for electronic components of the embodiment 3.

In the embodiment 3, the description has been made by taking the case where the guide portions 12 which correspond to the pair of cavities 11, 11 are integrally formed so as to communicate with each other as an example. However, for example, in the case where a plurality of cavities 11 are continuously formed on a disc-like storing member 10 at predetermined intervals in the circumferential direction, the guide portions 12 may be formed into one annular space which is continuously formed in the circumferential direction and opposedly faces the respective cavities 11.

Embodiment 4

Figure 8A:
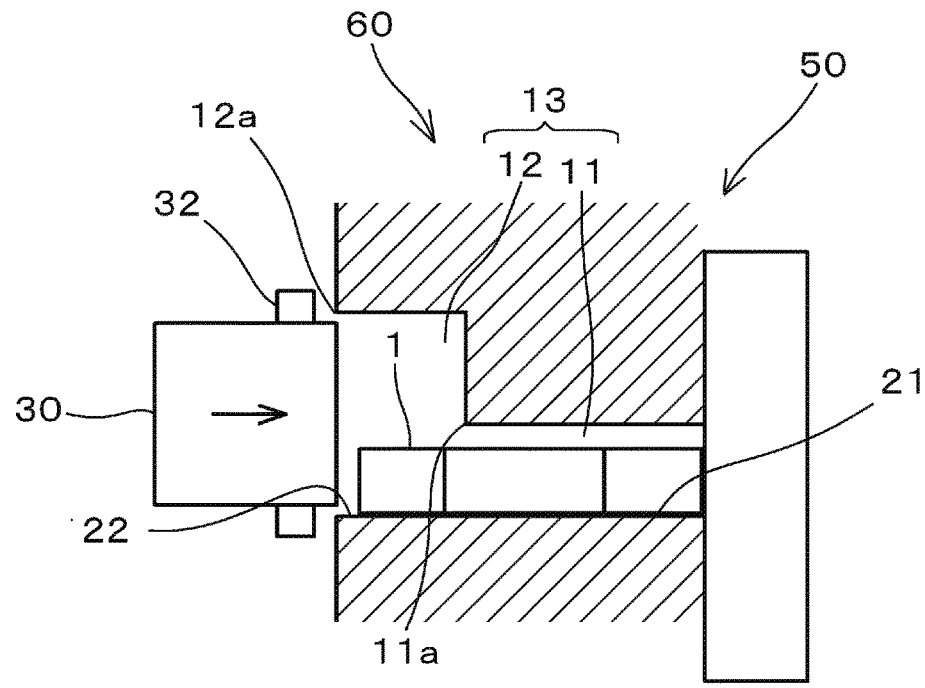
Figure 8B:
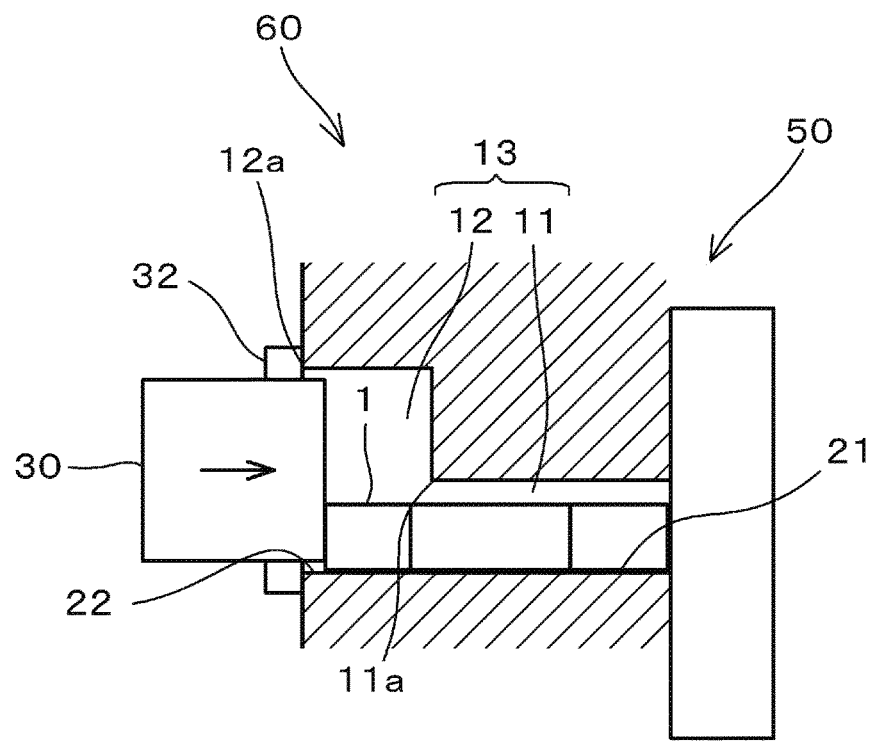
Figure 9:
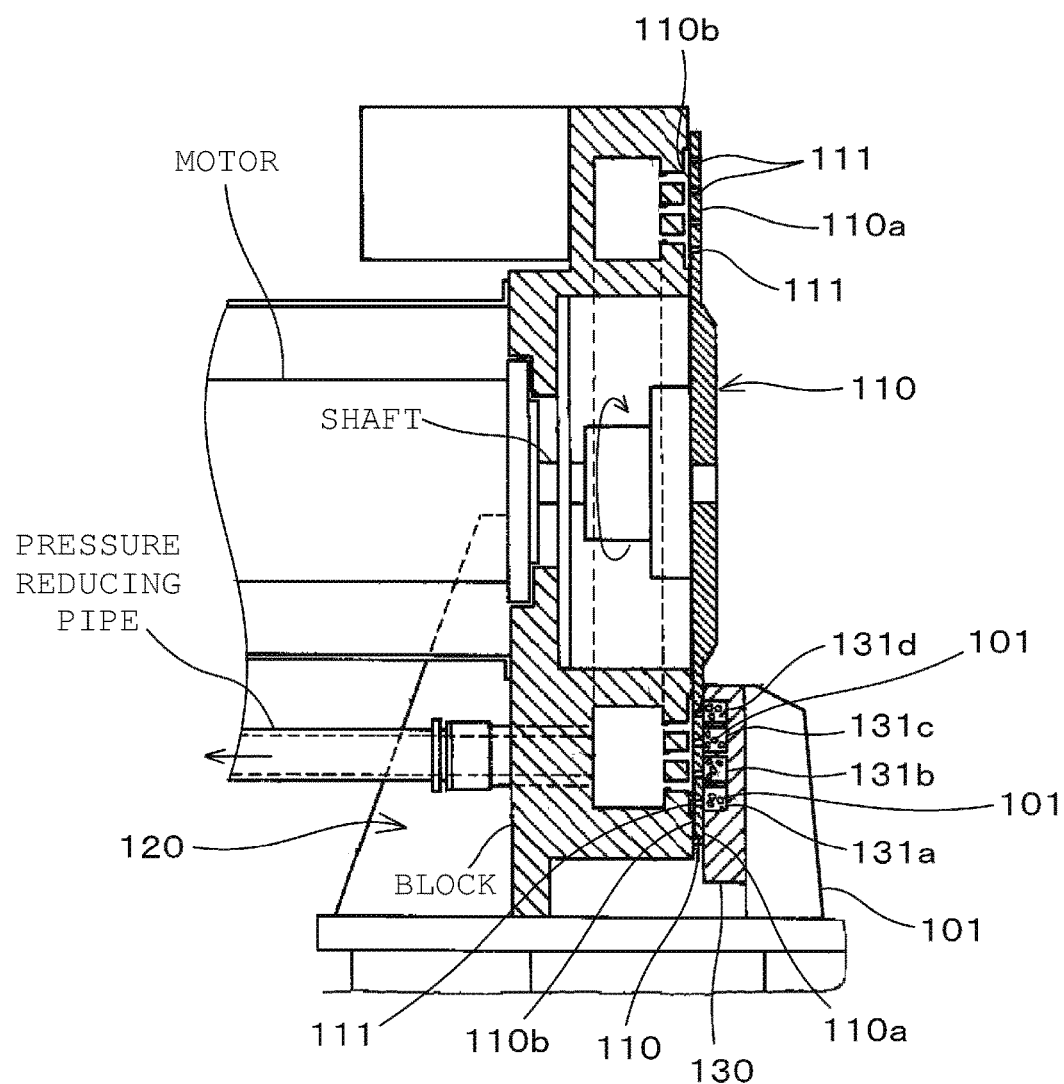
FIG. 9 is a view showing a conventional conveyance apparatus for electronic components.
Figure 10:
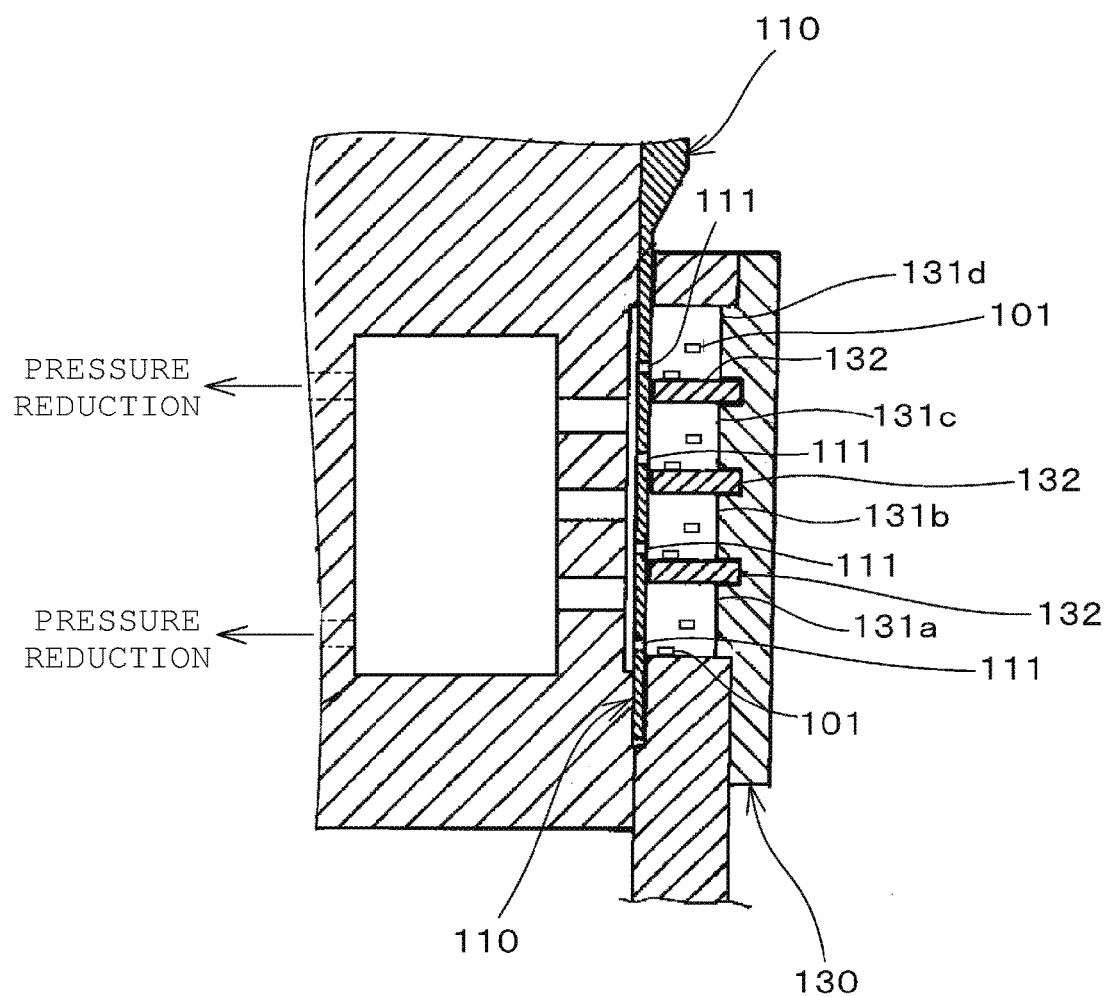
FIG. 10 is a view showing the configuration of a main part of the conventional conveyance apparatus for electronic components.

FIG. 8A and FIG. 8B are views showing the configuration of a main part of an apparatus 60 for industrial use according to an embodiment 4 of the present disclosure which uses a conveyance apparatus for electronic components.

As shown in FIG. 8A and FIG. 8B, the apparatus 60 for industrial use of the embodiment 4 includes the above-mentioned conveyance apparatus 50 for electronic components of the embodiment 1, and an action portion 30 which sequentially acts on electronic components stored in a plurality of cavities 11. For example, the apparatus 60 for industrial use of the embodiment 4 includes a measurement terminal for measuring an electrical property of the electronic component 1 as the action portion 30. That is, the apparatus 60 for industrial use of the embodiment 4 is formed as an inspection apparatus for measuring properties of the electronic component 1.

The action portion (measurement terminal) 30 which forms the apparatus 60 for industrial use (inspection apparatus) of the embodiment 4 includes a positioning portion 32 which is brought into contact with a main surface of a storing member 10 for setting an insertion depth of a distal end of the action portion (measurement terminal) 30 into a guide portion 12.

In the apparatus 60 for industrial use (inspection apparatus) having such a configuration, the guide portion 12 plays a role of a guide for positioning the action portion (measurement terminal) 30 and hence, it is possible to hold the relative positional accuracy between the electronic component 1 and the action portion (measurement terminal) 30 at a high level, whereby the inspection can be performed with high accuracy.

Further, the action portion (measurement terminal) 30 includes the positioning portion 32 and hence, an insertion depth of the action portion (measurement terminal) into the guide portion 12 can be controlled (see FIG. 8B). Accordingly, this can prevent the electronic component from being damaged by the abnormal insertion of the action portion 30 and hence, the properties of the electronic component 1 can be inspected with high accuracy.

In the embodiment 4, the description has been made with respect to the case where the action portion 30 is a measurement terminal for measuring an electrical property. However, for example, the action portion may be a tool or a laser generating unit for acting on an electronic component, an imaging unit such as a camera, a light source for emitting an infrared ray or the like, a dispenser for applying a paste such as a conductive paste or an insulating paste. Further, other elements may be used as the action portion.

In the apparatus 60 for industrial use of the embodiment 4, in the same manner as the configuration in the embodiment 3, the guide portions 12 may extend between the pair of cavities 11, 11 in a communicating manner. In such a case, when the action portion 30 acts on the respective electronic components 1 stored in the plurality of cavities 11 (see FIG. 8), the action portion 30 can be continuously guided along the communicating guide portion 12 and hence, it is possible to efficiently make the cavities 11 and the action portion 30 opposedly face each other with high accuracy. Accordingly, the configuration of the apparatus 60 for industrial use of the embodiment 4 is considerably useful.

The guide portions 12 are not limited to the pair of cavities 11, 11. For example, when the plurality of cavities 11 are formed on the disc-like storing member 10 at predetermined intervals in the circumferential direction, the guide portions 12 may be formed of one annular space which is continuously formed in the circumferential direction and opposedly faces the respective cavities 11. In such a case, when the action portion (see FIG. 8) acts on the respective electronic components 1 stored in the plurality of cavities 11 continuously formed in the circumferential direction, the action portion 30 can be continuously guided along the guide portion 12 formed of an annular space and hence, the position of the cavity 11 and the position of the action portion 30 can be controlled. As a result, when the action portion 30 is sequentially made to opposedly face the plurality of electronic components 1, it is possible to more efficiently make the electronic components 1 and the action portion 30 opposedly face each other with high accuracy.

The present disclosure is not limited to the above-mentioned respective embodiments also with respect to points other than the points described heretofore, and various modifications and variations are conceivable within the scope of the present disclosure.

What is claimed is:
1. A conveyance apparatus for electronic components comprising:
   a storing member having a plurality of cavities in which an electronic component is stored respectively,
   an electronic component supply mechanism configured to supply a plurality of electronic components to be stored in the cavities to the storing member; and
   a moving unit configured to move the storing member in a predetermined direction in a relative relationship with the electronic component supply mechanism, the electronic components being sequentially stored in the plurality of cavities by moving the storing member and the electronic component supply mechanism relative to each other such that the plurality of respective cavities opposedly face the electronic components sequentially supplied from the electronic component supply mechanism, a depth of the cavity being set to a depth which allows a portion of the electronic component to project from the cavity in a state where the electronic component is stored in the cavity in a predetermined posture, the storing member including guide portions each of which is a space communicating with the cavity and configured to guide the electronic component into the cavity, the guide portion being formed such that a guide opening portion which is an opening portion of the guide portion is larger than an opening portion of the cavity and the opening portion of the cavity falls within a region of the guide opening portion as viewed in a depth direction of the cavity, and a storing space formed of the cavity and the guide portion being configured to store an entire electronic component in the inside thereof.

2. The conveyance apparatus for electronic components according to claim 1, wherein the guide portion has a size which prevents another electronic component from projecting from the guide portion, even when said another electronic component enters the guide portion in a state where the electronic component is stored in the cavity.

3. The conveyance apparatus for electronic components according to claim 1, wherein among the plurality of cavities which the storing member has, the guide portions which correspond to at least a pair of cavities adjacent to each other in a direction of relative movement between the electronic component supply mechanism and the storing member are formed integrally so as to communicate with each other.

4. An apparatus for industrial use comprising:

the conveyance apparatus for electronic components according to claim 1; and an action portion which acts on the electronic components stored in the plurality of cavities, the storing member and the action portion being configured to be sequentially moved relative to each other such that the plurality of cavities in which the electronic components are stored opposedly face the action portion sequentially, and the action portion being configured to act on the electronic component in a state where at least a portion of the action portion is inserted into the guide portion.

* * * * *